(12) United States Patent
Shan et al.

(10) Patent No.: US 6,251,795 B1
(45) Date of Patent: *Jun. 26, 2001

(54) METHOD FOR DEPOSITING HIGH DENSITY PLASMA CHEMICAL VAPOR DEPOSITION OXIDE WITH IMPROVED TOPOGRAPHY

(75) Inventors: Jesse C. Shan, Vancouver; Chang-Kuei Huang, Camas; Steve H. Y. Yang, Vancouver, all of WA (US)

(73) Assignee: WaferTech, L.L.C., Camas, WA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/288,490

(22) Filed: Apr. 8, 1999

(51) Int. Cl.[7] .................................................... H01L 21/42
(52) U.S. Cl. .......................... 438/723; 438/761; 438/763; 438/788; 427/563; 427/579; 427/574; 204/192.32; 204/192.35; 204/192.37; 204/192.23

(58) Field of Search ..................................... 438/761, 763, 438/788, 723; 427/563, 579, 574; 204/192.32, 192.35, 192.37, 192.23

(56) References Cited

U.S. PATENT DOCUMENTS

| | | | | |
|---|---|---|---|---|
| 4,465,552 | * | 8/1984 | Bobbio et al. | 204/192.32 |
| 4,732,761 | * | 3/1988 | Machida et al. | 438/723 |
| 5,286,518 | * | 2/1994 | Cain et al. | 427/579 |
| 5,494,854 | * | 2/1996 | Jain | 438/761 |
| 5,679,606 | * | 10/1997 | Wang et al. | 438/788 |
| 5,814,564 | * | 9/1998 | Yao et al. | 438/723 |
| 6,037,018 | * | 3/2000 | Jang et al. | 427/579 |

* cited by examiner

*Primary Examiner*—Mark F. Huff
*Assistant Examiner*—Daborah Chacko-Davis
(74) *Attorney, Agent, or Firm*—George O. Saile; Stephen B. Ackerm; Larry J. Prescot

(57) ABSTRACT

A method of forming a self-planarized HDPCVD oxide layer over a substrate having uneven topography in a process chamber is disclosed. The method comprising the steps of: depositing HDPCVD oxide over said uneven topography; and performing a sputter-only step in said process chamber.

27 Claims, 2 Drawing Sheets

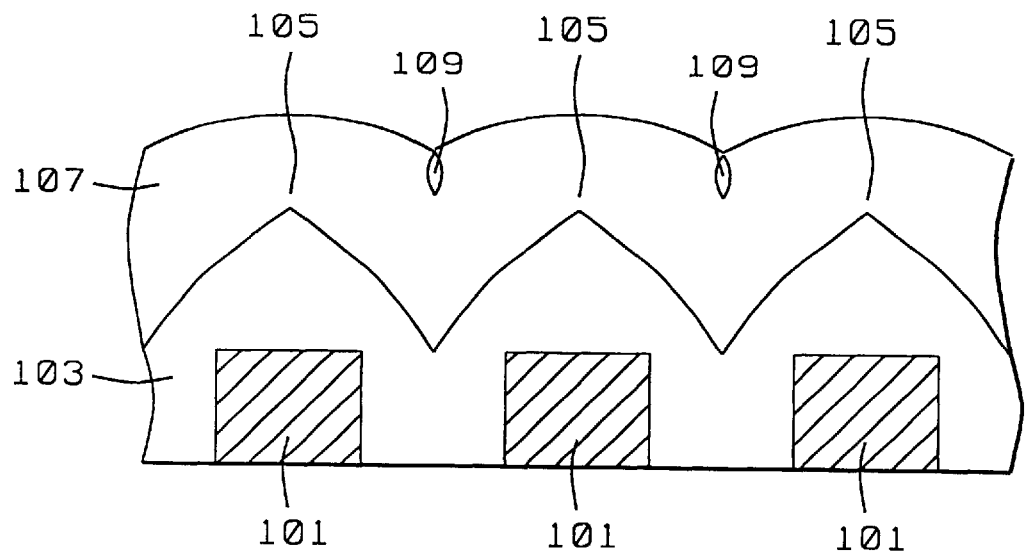
*FIG. 1 - Prior Art*
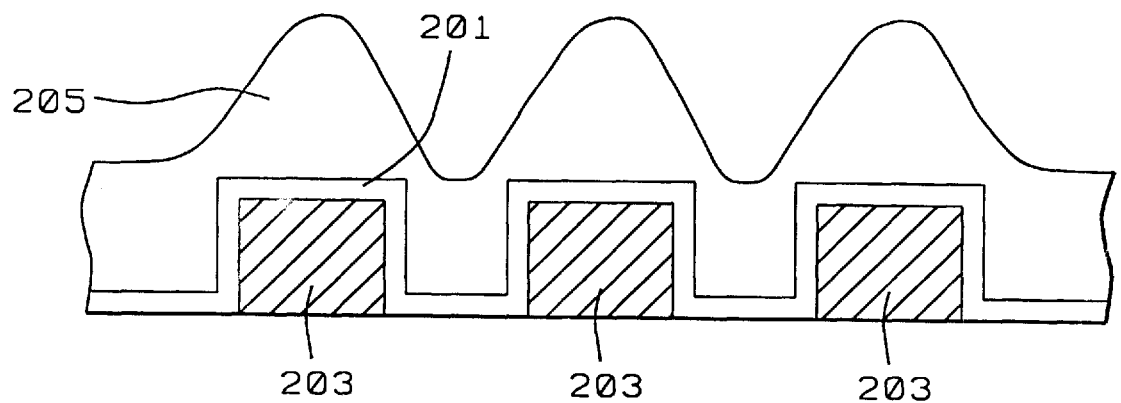
*FIG. 2*

METHOD FOR DEPOSITING HIGH DENSITY PLASMA CHEMICAL VAPOR DEPOSITION OXIDE WITH IMPROVED TOPOGRAPHY

FIELD OF THE INVENTION

The present invention relates to the deposition of high density plasma chemical vapor deposition (HDPCVD) oxides, and more particularly, to a method of depositing a HDPCVD oxide that has improved planarization.

BACKGROUND OF THE INVENTION

Metal interconnect structures are an important part of VLSI integrated circuits. The metal interconnect structures typically include metal lines and vias. The vias are used to interconnect the metal lines with conductive structures above and below the metal interconnect layer. Sophisticated ICs may include several layers of metal interconnect structures. The metal lines are commonly used on VLSI integrated circuits for carrying digital signals, analogs signals, or bias power to and from the embedded semiconductor devices.

Metal interconnects on different levels and on the same level must be electrically isolated from one another to avoid short circuits. Typically, after metal lines have been formed through metal etching, a dielectric layer is deposited over the metal lines for insulation purposes. This dielectric layer is referred to as either an intermetal dielectric (IMD), or an interlayer dielectric (ILD). The insulating dielectric layer typically is formed from a composite of multiple layers of oxide. For example, in many processes, the insulative dielectric layer comprises a bulk oxide layer followed by a cap oxide layer.

As the aspect ratios of the gaps between metal lines increases, it has been found that conventional chemical vapor deposition of oxides oftentimes fail to exhibit acceptable gap filling characteristics. Imperfections and discontinuities such as keyholes and incomplete filling occur.

One type of oxide that has demonstrated encouraging gap filling capabilities is the high density plasma chemical vapor deposition (HDPCVD) oxide. HDPCVD oxide technology has only been recently developed in the past few years. Thus, HDPCVD oxide remains a promising gap filling alternative for high aspect ratio gaps.

Another important consideration when forming an IMD or ILD is the planarity of the top surface of the oxide. For a multitude of reasons, it is important that the IMD have a planar surface. Because of the topography of the metal interconnect structure, it is sometimes difficult to achieve a planar oxide surface with HDPCVD oxides. Further, because of the particular characteristics of HDPCVD oxide, it has been found that triangular peaks are formed on the top of metal lines. This can be seen in FIG. 1, where exemplary metal lines 101 are formed atop of a substrate. A layer of HDPCVD oxide 103 is deposited over the metal lines 101. Unfortunately, during the deposition prosess, triangular peaks 105 are formed atop the metal lines 101.

Because of the triangular peaks 105, a subsequently deposited plasma enhanced (PE) oxide layer 107 has variations in its topography. The topography of the cap PE oxide layer 107 is very sensitive to the topography of the underlying layer. If the peaks 105 have a positive curvature (i.e., convex to the surface), then the cap oxide layer 107 will form a "keyhole" 109. However, if the curvature can be made negative (i.e. concave to the surface), then the cap oxide layer 107 will be a smoother topography with less step height. With a lower step height, less further processing of the PE oxide layer 107 through a chemical mechanical polishing (CMP) process is necessary.

If the HDPCVD oxide layer 105 could be deposited in such a manner so as to reduce the triangular peaks 105 and to make them concave, then the variation in topography of the PE oxide layer 107 may be reduced, thereby reducing the amount of CMP required (and also the thickness of the PE oxide layer 107). This would improve cost and throughput during the manufacturing process.

SUMMARY OF THE INVENTION

A method of forming an HDPCVD oxide layer over a substrate having uneven topography in a process chamber is disclosed. The method comprising the steps of: depositing HDPCVD oxide over said uneven topography; and performing a sputter-only step in said process chamber.

The sputter agent during the sputter-only step may be selected from the group $C_2F_6$, $CF_4$, $C_4F_8$, $CHF_3$, $SF_6$, $CF_2Cl_2$, $Cl_2$, $BCl_3$, Ar, or CO.

Further, the method may further include the step of depositing a liner oxide layer onto said uneven topography prior to the formation of the HDPCVD oxide.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a cross-sectional view of a semiconductor substrate showing a prior art IMD process;

FIGS. 2 and 3 are cross-sectional views of a semiconductor substrate illustrating the steps of the present invention.

DETAILED DESCRIPTION OF THE PREFERRED EMBODIMENT

Figure 3:
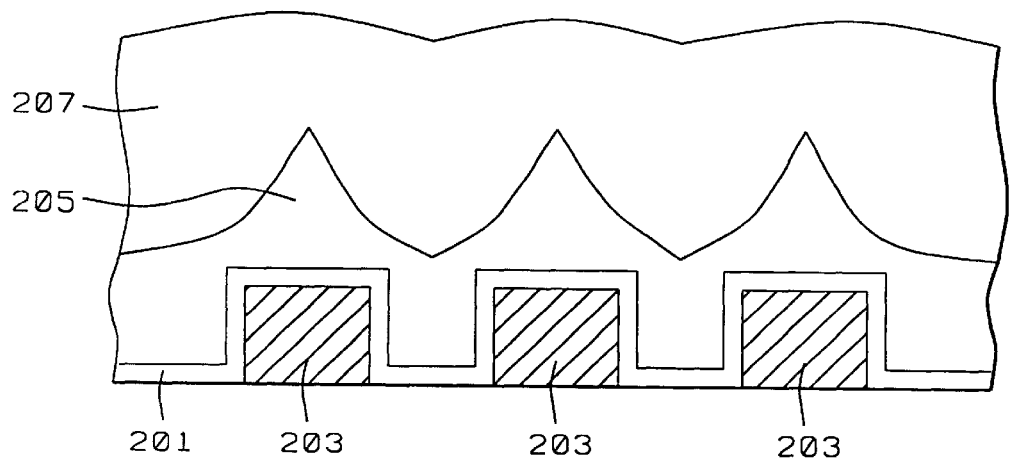

The mechanism by which the HDPCVD oxide is formed is by a combination of deposition and sputtering (also known as "sputter-etch" or simply "etch" in the art). The most widely used apparatus for the formation of HDPCVD oxide is manufactured by Applied Materials and referred to as the Ultima model.

The deposition process of the Ultima apparatus results from a low frequency RF power source that drives silicon (from silane) and oxygen ions towards the surface of the wafer to form a silicon oxide. The sputtering process of the Ultima apparatus results from a high frequency bias power that drives inert gas ions (typically argon) towards the surface of the wafer. As can be appreciated by those skilled in the art, sputtering in the HDPCVD oxide art refers to the process of bombarding deposited oxide with inert gas ions in order to dislodge oxide particles. Thus, the deposition process forms oxide on the wafer and the sputtering process dislodges and rearranges the deposited oxide on the wafer.

The formation of the HDPCVD oxide of the present invention was experimentally performed on the Ultima apparatus. That apparatus uses gas nozzles on the sides of the wafer and also from above the wafer to supply the silane, oxygen, and argon gas for the HDPCVD oxide forming process. The optimal D/S ratio range for the Ultima apparatus is from 2.8 to 6. The formation of the HDPCVD oxide is formed by flowing silane ($SiH_4$) in combination with oxygen. By controlling the flow rate of the silane and the oxygen at the side nozzles and the top nozzles, the deposition rate of the HDPCVD oxide can be changed. Further, by controlling the high frequency bias power and the argon gas flow rate, the sputtering rate can be adjusted. Thus, by combining control of the sputter rate and the deposition rate, the D/S ratio can be calculated and controlled.

With that background, the present invention is a process for forming HDPCVD oxide having a reduced peak over metal lines. In general, the first step involves the deposition of HDPCVD oxide over the metal lines to a predetermined thickness. The second step is a sputter-only step that planarizes the HDPCVD oxide. Importantly, the sputter-only step is performed in the same apparatus under the same conditions as the deposition step, thereby improving efficiency.

Specifically, turning to FIG. 2, in accordance with the present invention, a liner oxide 201 is first formed over the metal lines 203. The liner oxide preferably has a thickness of less than 1,000 angstroms and is formed only by deposition. In other words, the sputtering technique is not used in forming the liner oxide. In the Ultima apparatus, the sputtering can be eliminated by turning off the high frequency bias power and by shutting off argon gas flow. The liner oxide serves to protect the metal lines 203 from the harmful side effects of forming the HDPCVD oxide layer.

After the liner oxide 201 has been deposited, a HDPCVD oxide layer 205 is deposited continuously until the gaps between the metal lines 203 have been filled. Preferably, because of the sputter-only step described below, the HDPCVD oxide layer 205 is "overgrown" to account for loss during the sputter-only step. In one actual embodiment, if a final thickness of 6200 angstroms is desired, then the initial deposition process should be to 6500 angstroms thick. The sputter-only step will remove or consume about 300 angstroms.

For the Ultima apparatus, the following process parameters are used to deposit the HDPCVD oxide layer 205:

Deposition-to-Sputter Ratio=3

|  | Deposition Step |
| --- | --- |
| RF power top | 1300 watts |
| RF power side | 3100 watts |
| RF power bias | 2800 watts |
| Argon flow side | 110 sccm |
| Argon flow top | 16 sccm |
| Oxygen side | 110 sccm |
| Oxygen top | 16 sccm |
| SiH4 side | 46 sccm |
| SiH4 top | 9 sccm |

Although preferred settings are provided, there are acceptable ranges. For example, the RF power for the top is between 1300 to 1700 watts, for the side is between 2800 to 3500 watts, and for the bias power is between 2700 to 3500 watts. Preferably, the pressure in the deposition chamber is in the millitorr range. This can be accomplished by pumping down the chamber and setting the throttle valve of the Ultima apparatus in the fully open position. Finally, prior to the beginning of the deposition process, the power is ramped up from 1000 watts to the 2700 watts range.

Further, it should be noted that the deposition of the HDPCVD oxide layer 205 may be done at a single D/S ratio or in a step like fashion as detailed in my co-pending U.S. patent application Ser. No. 09/199,835 entitled "Method for Depositing High Density Plasma Chemical Vapor Deposition Oxide in High Aspect Ratio Gaps" filed Nov. 25, 1998 herein incorporated by reference.

Following the deposition step, a sputter-only step is performed with argon gas as the sputter agent. The sputter step uses the following process parameters:

|  | Planarization Step |
| --- | --- |
| RF power top | 1300 watts |
| RF power side | 3100 watts |
| RF power bias | 2800 watts |
| Argon flow side | 110 sccm |
| Argon flow top | 16 sccm |
| Oxygen side | 60 sccm |
| Oxygen top | 8 sccm |
| SiH4 side | 0 sccm |
| SiH4 top | 0 sccm |

Although in the preferred embodiment, argon is used as the sputtering agent, $C_2F_6$, $CF_4$, $C_4F_8$, $CHF_3$, $SF_6$, $CF_2Cl_2$, $Cl_2$, $BCl_3$, and CO may also be used.

The resulting structure is seen in FIG. 3. Note that the target thickness of the HDPCVD layer 205 is substantially the same as that in the prior art of FIG. 1. As illustrated in FIG. 3 and as confirmed experimentally, the sputter-only step reduces the magnitude of the triangular peaks 105 by more than 50% as well as make their profile concave. The effect of this is better topography which results in a lower amount of thickness required for a subsequently deposited cap oxide layer. This in turn results in reduced CMP requirements and the associated improvement in throughput. Thus, in FIG. 3, a subsequently deposited cap (PE) oxide layer 207 is shown to have much better planarity and lower required thickness.

Specifically, to receive the same results of 10000 angstroms oxide remaining on the metal after CMP, the prior art process comprises the steps of: depositing gap-filling CVD oxide to about 5k angstroms, depositing a cap oxide (PE) layer to about 19k angstroms, and then performing a CMP step to remove approximately 14k angstroms of material (10k angstroms left). In the method of the present invention, a gap-filling HDPCVD oxide of about 6k angstroms (deposition of 6.3k angstroms followed by sputter-only of 300 angstroms) is formed. Next, the cap oxide (PE) layer of about 14k angstroms is deposited. This is followed by a CMP step that removes 10k angstroms (also 10k angstroms left). A comparison between the prior art and present invention reveals that a greater than 20% reduction in the amount of PE oxide required is achieved and that about 40% less CMP is required. This increases throughput and decreases cost. Furthermore, because of the step height improvement (resulting from the smaller triangular peaks), the polish rate is much faster leading to a polish time reduction from 240 seconds to 98 seconds in one actual experimental embodiment.

Figure 4:
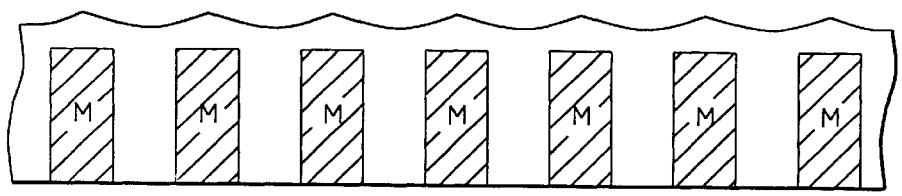
FIG. 4 is a cross sectional view of a semiconductor substrate having narrow metal lines and using the present invention.

It has further been found by the inventors that the method of the present invention is particularly effective for narrow width metal lines. Specifically, it has been experimentally found that the narrower the metal lines, the smaller the triangular peaks formed thereon by use of the present invention. In FIG. 3, the metal lines have a width on the order of 0.4 to 0.5 microns. This results in still fairly significant peaks. However, FIG. 4 shows a plurality of metal lines (M) having a width of on the order of 0.2 microns. The result of the method of the present invention in depositing the HDPCVD oxide layer using deposition and sputter-only is an almost flat surface. Therefore, the method of the present invention is even more advantageously used as the metal lines decrease in size.

While the preferred embodiment of the invention has been illustrated and described, it will be appreciated that various changes can be made therein without departing from the spirit and scope of the invention. For example, although the preferred embodiment is in the context of the formation of a IMD, the combination of HDPCVD deposition followed by a sputter-only step may be applied to shallow trench isolation (STI) and passivation layers where the HDPCVD is used for gap fill.

What is claimed is:

1. A method of forming an HDPCVD oxide layer over a substrate having uneven topography in a process chamber, the method comprising:
    depositing HDPCVD oxide over said uneven topography; and then after a predetermined thickness of said HDPCVD oxide has been deposited, wherein said predetermined thickness is greater than the desired final thickness of said HDPCVD oxide, performing a sputter only step in said process chamber, thereby planarizing said HDPCVD oxide; and
    depositing a PECVD cap oxide layer over said HDPCVD oxide layer.

2. The method of claim 1 wherein said uneven topography includes metal lines.

3. The method of claim 1 wherein said sputter only step uses Argon as a sputter agent.

4. The method of claim 1 wherein said sputter only step is done using a gas from the group consisting of $C_2F_6$, $CF_4$, $C_4F_8$, $CHF_3$, $SF_6$, $CF_2Cl_2$, $Cl_2$, $BCl_3$, and CO.

5. The method of claim 1 wherein said depositing HDPCVD oxide over said uneven topography uses flowing silane gas and oxygen gas.

6. The method of claim 1 wherein said depositing HDPCVD oxide over said uneven topography uses sputtering during deposition.

7. The method of claim 1 further comprising the step of depositing a liner oxide layer on said uneven topography prior to the deposition of said HDPCVD oxide.

8. A method of forming an HDPCVD oxide layer, comprising:
    providing a substrate having uneven topography;
    providing a processing chamber;
    placing said substrate in said processing chamber;
    depositing a layer of HDPCVD oxide having a predetermined thickness, wherein said predetermined thickness is greater than the desired final thickness of said layer of HDPCVD oxide, on said substrate having uneven topography, after placing said substrate in said processing chamber;
    planarizing said layer of HDPCVD oxide using only a planarization sputtering in said processing chamber;
    depositing a PECVD cap oxide layer over said HDPCVD oxide layer; and
    removing said substrate from said processing chamber after planarizing said layer of HDPCVD oxide.

9. The method of claim 8 wherein said forming a layer of HDPCVD oxide uses a combination of a deposition, at a deposition rate, and a first sputtering, at a sputtering rate.

10. The method of claim 9 wherein said deposition uses flowing silane gas and oxygen gas, and control of said deposition rate comprises controlling the flow rates of said silane gas and said oxygen gas.

11. The method of claim 9 wherein said first sputtering uses flowing argon gas, and control of said sputtering rate comprises controlling the flow rate of said argon gas.

12. The method of claim 9 wherein said deposition rate and said sputtering rate are adjusted so that the ratio of said deposition rate to said sputtering rate is between about 2.8 and 6.0.

13. The method of claim 8 wherein said planarization sputtering uses argon gas.

14. The method of claim 8 wherein said planarization sputtering uses a gas from the group consisting of $C_2F_6$, $CF_4$, $C_4F_8$, $CHF_3$, $SF_6$, $CF_2Cl_2$, $Cl_2$, $BCl_3$, and CO.

15. The method of claim 8 wherein said substrate having uneven topography comprises a semiconductor substrate having metal lines formed thereon.

16. The method of claim 8 wherein said forming a layer of HDPCVD oxide on said substrate having uneven topography results in a layer of HDPCVD oxide wherein the lowest point of the top surface of said layer of HDPCVD oxide is above the highest point of the top surface of said substrate having uneven topography.

17. A method of forming an HDPCVD oxide layer, comprising:
    providing a substrate having uneven topography;
    providing a processing chamber;
    placing said substrate in said processing chamber;
    forming a layer of liner oxide on said substrate having uneven topography using a first deposition with no sputtering, after placing said substrate in said processing chamber;
    depositing a layer of HDPCVD oxide having a predetermined thickness, wherein said predetermined thickness is greater than the desired final thickness of said layer of HDPCVD oxide, on said layer of liner oxide;
    planarizing said layer of HDPCVD oxide using only a planarization sputtering in said processing chamber;
    depositing a PECVD cap oxide layer over said HDPCVD oxide layer; and
    removing said substrate from said processing chamber after planarizing said layer of HDPCVD oxide.

18. The method of claim 17 wherein said first deposition uses flowing silane gas and oxygen gas.

19. The method of claim 17 wherein said layer of liner oxide has a thickness of less than 1000 Angstroms.

20. The method of claim 17 wherein said forming a layer of HDPCVD oxide uses a combination of a second deposition, at a deposition rate, and a first sputtering, at a sputtering rate.

21. The method of claim 20 wherein said second deposition uses flowing silane gas and oxygen gas, and control of said deposition rate comprises controlling the flow rates of said silane gas and said oxygen gas.

22. The method of claim 20 wherein said first sputtering uses flowing argon gas, and control of said sputtering rate comprises controlling the flow rate of said argon gas.

23. The Method of claim 20 wherein said deposition rate and said sputtering rate are adjusted so that the ratio of said deposition rate to said sputtering rate is between about 2.8 and 6.0.

24. The method of claim 17 wherein said planarization sputtering uses flowing argon gas.

25. The method of claim 17 wherein said planarization sputtering uses a gas from the group consisting of $C_2F_6$, $CF_4$, $C_4F_8$, $CHF_3$, $SF_6$, $CF_2Cl_2$, $Cl_2$, $BCl_3$, and CO.

26. The method of claim 17 wherein said substrate having uneven topography comprises a semiconductor substrate having metal lines formed thereon.

27. The method of claim 17 wherein said forming a layer of liner oxide on said substrate having uneven topography and forming a layer HDPCVD oxide on said layer of liner oxide results in a layer of HDPCVD oxide wherein the lowest point of the top surface of said layer of HDPCVD oxide is above the highest point of the top surface of said substrate having uneven topography.

* * * * *

UNITED STATES PATENT AND TRADEMARK OFFICE
CERTIFICATE OF CORRECTION

PATENT NO. : 6,251,795 B1
DATED : June 26, 2001
INVENTOR(S) : Jesse C. Shan, Chang-Kuei Huang, Steve H. Y. Yang It is certified that error appears in the above-identified patent and that said Letters Patent is hereby corrected as shown below:

<u>Title page,</u>
Item [74], please delete "Larry J. Prescot" and replace with -- Larry J. Prescott --.

Signed and Sealed this

Fourth Day of December, 2001

*Attest:*

NICHOLAS P. GODICI
*Attesting Officer*  *Acting Director of the United States Patent and Trademark Office*